(12) United States Patent
Lee et al.

(10) Patent No.: US 11,327,352 B2
(45) Date of Patent: May 10, 2022

(54) DISPLAY DEVICE

(71) Applicant: Samsung Display Co., LTD., Yongin-si (KR)

(72) Inventors: Sang Myoung Lee, Asan-si (KR); In Ho Park, Asan-si (KR); Joo Lark Son, Suwon-si (KR); Min Cheol Chae, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/150,471

(22) Filed: Jan. 15, 2021

(65) Prior Publication Data
US 2022/0011623 A1     Jan. 13, 2022

(30) Foreign Application Priority Data
Jul. 10, 2020     (KR) ........................ 10-2020-0085162

(51) Int. Cl.
  *G02F 1/1333*     (2006.01)
  *H01L 51/52*      (2006.01)
  *G02F 1/1345*     (2006.01)
  *H01L 27/32*      (2006.01)

(52) U.S. Cl.
  CPC .... *G02F 1/133317* (2021.01); *G02F 1/13452* (2013.01); *G02F 1/133331* (2021.01); *G02F 1/133334* (2021.01); *H01L 51/5246* (2013.01); *H01L 27/3244* (2013.01)

(58) Field of Classification Search
  None
  See application file for complete search history.

(56) References Cited

U.S. PATENT DOCUMENTS

| | | | |
|---|---|---|---|
| 8,872,997 B2 | 10/2014 | Rothkopf et al. | |
| 9,928,762 B2 | 3/2018 | Franklin et al. | |
| 2013/0021557 A1* | 1/2013 | Momose | G02B 6/0036 349/62 |
| 2016/0377911 A1* | 12/2016 | Wu | G02F 1/133553 349/106 |
| 2017/0358781 A1* | 12/2017 | Kang | H01L 51/5253 |

FOREIGN PATENT DOCUMENTS

| | | |
|---|---|---|
| KR | 10-2006-0017105 | 2/2006 |
| KR | 10-2019-0007750 | 1/2019 |
| KR | 10-2020-0005710 | 1/2020 |

\* cited by examiner

*Primary Examiner* — Richard H Kim
(74) *Attorney, Agent, or Firm* — Kile Park Reed & Houtteman PLLC (57) ABSTRACT

A display device includes a first substrate including a first side surface, a display area, and a pad area located outside of the display area and adjacent to the first side surface, a second substrate facing the first substrate and including a second side surface extending further outward than the first side surface of the first substrate, a printed circuit board electrically connected to the pad area of the first substrate and bent along the first side surface of the first substrate, and a light blocking chassis overlapping the printed circuit board and the first side surface of the first substrate.

22 Claims, 10 Drawing Sheets

DISPLAY DEVICE

CROSS-REFERENCE TO RELATED APPLICATION(S)

This application claims priority to and benefits of Korean Patent Application No. 10-2020-0085162 under 35 U.S.C. § 119 filed on Jul. 10, 2020 in the Korean Intellectual Property Office, the entire contents of which are incorporated herein by reference.

BACKGROUND

1. Technical Field

The disclosure relates to a display device.

2. Description of the Related Art

The importance of display devices has steadily increased with the development of multimedia technology. Accordingly, various types of display devices such as a liquid crystal display (LCD) device, an organic light emitting display (OLED) device and the like have been implemented.

Among display devices, the organic light emitting display device displays an image by using an organic light emitting element that emits light by recombination of electrons and holes. The organic light emitting display device may include transistors that may provide a driving current to the organic light emitting element. In a non-self-light emitting display device such as a liquid crystal display device, a display panel that generates an image does not emit light by itself, and generates an image using light provided from a backlight unit. The backlight unit may include a light source and a light guide plate that may guide light emitted from the light source for surface light emission.

Recently, in addition to research and development into the technical aspect of the display device, research and development into product design has been particularly emphasized in order to appeal more to consumers. Accordingly, efforts are being made to reduce the thickness of the display device and reduce the width of the bezel of the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device having a reduced bezel width.

However, aspects of the disclosure are not restricted to the ones set forth herein. The above and other aspects of the disclosure will become more apparent to one of ordinary skill in the art to which the disclosure pertains by referencing the detailed description of the disclosure given below.

An embodiment of a display device may include a first substrate including a first side surface, a display area, and a pad area located outside of the display area and adjacent to the first side surface; a second substrate facing the first substrate, the second substrate including a second side surface extending further outward than the first side surface of the first substrate; a printed circuit board electrically connected to the pad area of the first substrate and bent along the first side surface of the first substrate; and a light blocking chassis overlapping the printed circuit board and the first side surface of the first substrate.

The second substrate may include a first region having a first thickness; and a second region having a second thickness which may be smaller than the first thickness, the second region being disposed outside of the first region, and the second region at least partially overlaps the light blocking chassis.

A part of the light blocking chassis may be disposed in a space between the printed circuit board and the second region of the second substrate.

The second region of the second substrate may overlap the light blocking chassis in a plan view.

The second side surface of the second substrate may be aligned with an outer surface of the light blocking chassis.

The second substrate may further include a surface and another surface opposite to the surface, the another surface of the second substrate facing a top surface of the first substrate, the another surface of the second substrate may include a first other surface located in the first region of the second substrate; and a second other surface located in the second region of the second substrate, and the second other surface may be higher than the first other surface with respect to the top surface of the first substrate.

The surface of the second substrate may include a first surface disposed in the first region of the second substrate; and a second surface disposed in the second region of the second substrate, and the first surface and the second surface may be disposed on a same plane.

The light blocking chassis may include an insertion portion, at least a part of the insertion portion being disposed between the second region of the second substrate and the first substrate; and a side portion extending downward from an end of the insertion portion.

A thickness of the insertion portion of the light blocking chassis may be in a range of about 0.1 mm to about 0.3 mm.

The insertion portion of the light blocking chassis may extend in a first direction perpendicular to a thickness direction, and a width of the insertion portion of the light blocking chassis in the thickness direction and a second direction perpendicular to the first direction may be in a range of about 0.50 mm to about 0.99 mm.

The light blocking chassis may block light in at least a partial region of the light blocking chassis.

The light blocking chassis may have a black color in at least the partial region of the light blocking chassis.

Organic light emitting elements may be disposed in the display area of the first substrate.

The display device may further include a liquid crystal layer interposed between the first substrate and the second substrate.

An embodiment of a display device may include a display substrate including a first side surface, a display area, and a pad area located outside of the display area and adjacent to the first side surface; a printed circuit board electrically connected to the pad area of the display substrate and bent along the first side surface of the display substrate; and a light blocking chassis overlapping the printed circuit board and the first side surface of the display substrate.

The light blocking chassis may block light in at least a partial region of the light blocking chassis.

The light blocking chassis may have a black color in at least a partial region of the light blocking chassis.

Organic light emitting elements may be disposed in the display area of the display substrate.

The light blocking chassis may include an insertion portion overlapping the display substrate and a side portion extending from an end of the insertion portion to overlap at least a part of the first side surface of the display substrate.

A thickness of the insertion portion of the light blocking chassis may be in a range of about 0.1 mm to about 0.3 mm.

In the display device according to an embodiment, the bezel width of the display device may be reduced.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

As used herein, the singular forms "a," "an," and "the" are intended to include the plural forms as well, unless the context clearly indicates otherwise.

It will be further understood that the terms "comprises" and/or "comprising" "includes" and/or "including" and "have" and/or "having" and their variations thereof as used herein specify the presence of stated features or elements, but do not preclude the presence or addition of one or more other features or elements.

It will also be understood that when a layer is referred to as being "on" another layer or substrate, it may be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected and/or may be indirectly electrically connected with intervening layers, regions, or elements therebetween.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

As used herein, the term "unit" and/or "module" denotes a structure or element as illustrated in the drawings and as described in the specification. However, the disclosure is not limited thereto. The term "unit" and/or "module" is not to be limited to that which is illustrated in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Hereinafter, embodiments will be described in detail with reference to the accompanying drawings.

Figure 1:
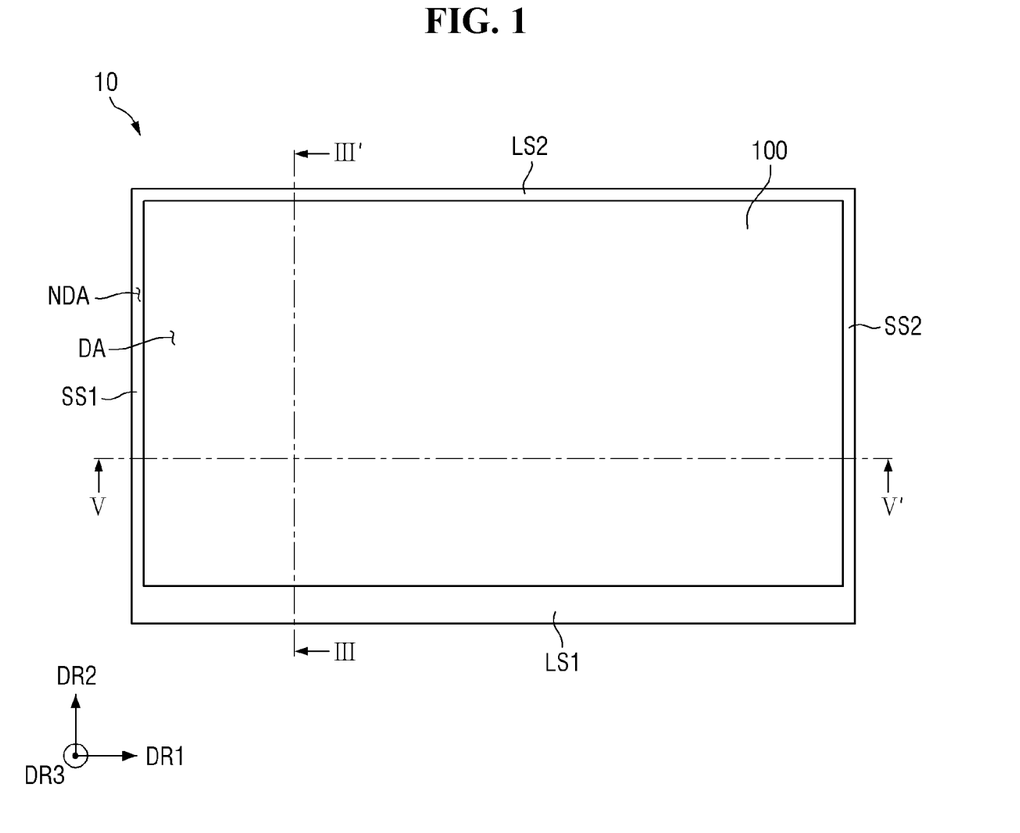
FIG. 1 is a plan view of a display device according to an embodiment.

FIG. 1 is a plan view of a display device according to an embodiment.

Referring to FIG. 1, in the drawing, a first direction DR1 indicates a horizontal direction of a display device 10 in a plan view, and a second direction DR2 indicates a vertical direction of the display device 10 in a plan view. A third direction DR3 indicates a thickness direction of the display device 10. The first direction DR1 and the second direction DR2 may perpendicularly intersect each other. The third direction DR3 may be a direction intersecting the plane on which the first direction DR1 and the second direction DR2 may be located, and may perpendicularly intersect both the first direction DR1 and the second direction DR2. It should be understood, however, that a direction mentioned in an embodiment refers to a relative direction and an embodiment is not limited to the direction mentioned.

Unless otherwise defined, with respect to the third direction DR3, the terms "above," "top surface," and "upper side" as used herein refer to a display surface's side of a display panel 100, and the terms "below," "bottom surface," and "lower side" as used herein refer to a side opposite to the display surface of the display panel 100.

The display device 10 according to an embodiment may have a substantially rectangular shape in a plan view. The display device 10 may have a substantially rectangular shape with substantially right-angled corners in a plan view. However, the disclosure is not limited thereto, and the display device 10 may have a substantially rectangular shape with substantially rounded corners in a plan view. The display device 10 may include four sides, two of which may be long sides LS1 and LS2 and the other two of which may be short sides SS1 and SS2.

In the plan view of FIG. 1, a short side located or disposed on the left side (one side or a side in the first direction DR1) and a short side located or disposed on the right side (the other side or another side in the first direction DR1) of the display device 10 may be referred to as a first short side SS1 and a second short side SS2, respectively. A long side located or disposed on the lower side (one side or a side in the second direction DR2) and a long side located or disposed on the upper side (the other side or another side in the second direction DR2) of the display device 10 may be referred to as a first long side LS1 and a second long side LS2, respectively.

The display device 10 may include a display area DA and a non-display area NDA. The display area DA may be an area on which a video or image may be displayed. The non-display area NDA may be an area which may be disposed around the display area DA and on which a video or image may not be displayed. The non-display area NDA may form a bezel.

In an embodiment, the non-display area NDA may be arranged or disposed to surround or may be adjacent to all sides of the display area DA. For example, in the display device 10, the width of the non-display area NDA positioned on the first long side LS1 may be, as shown in FIG. 1, larger than the width of the non-display area NDA positioned on the other sides SS1, SS2, and LS2. The non-display area NDA on the other sides SS1, SS2, and LS2 may have substantially the same width, but is not limited thereto. In an embodiment, the non-display area NDA may not be substantially present on the three sides SS1, SS2, and LS2 among the four sides LS1, LS2, SS1, and SS2 of the display device 10. In an embodiment, in the display device 10, the non-display area NDA may not be substantially present on all of the four sides LS1, LS2, SS1, and SS2 in a plan view.

Figure 2:
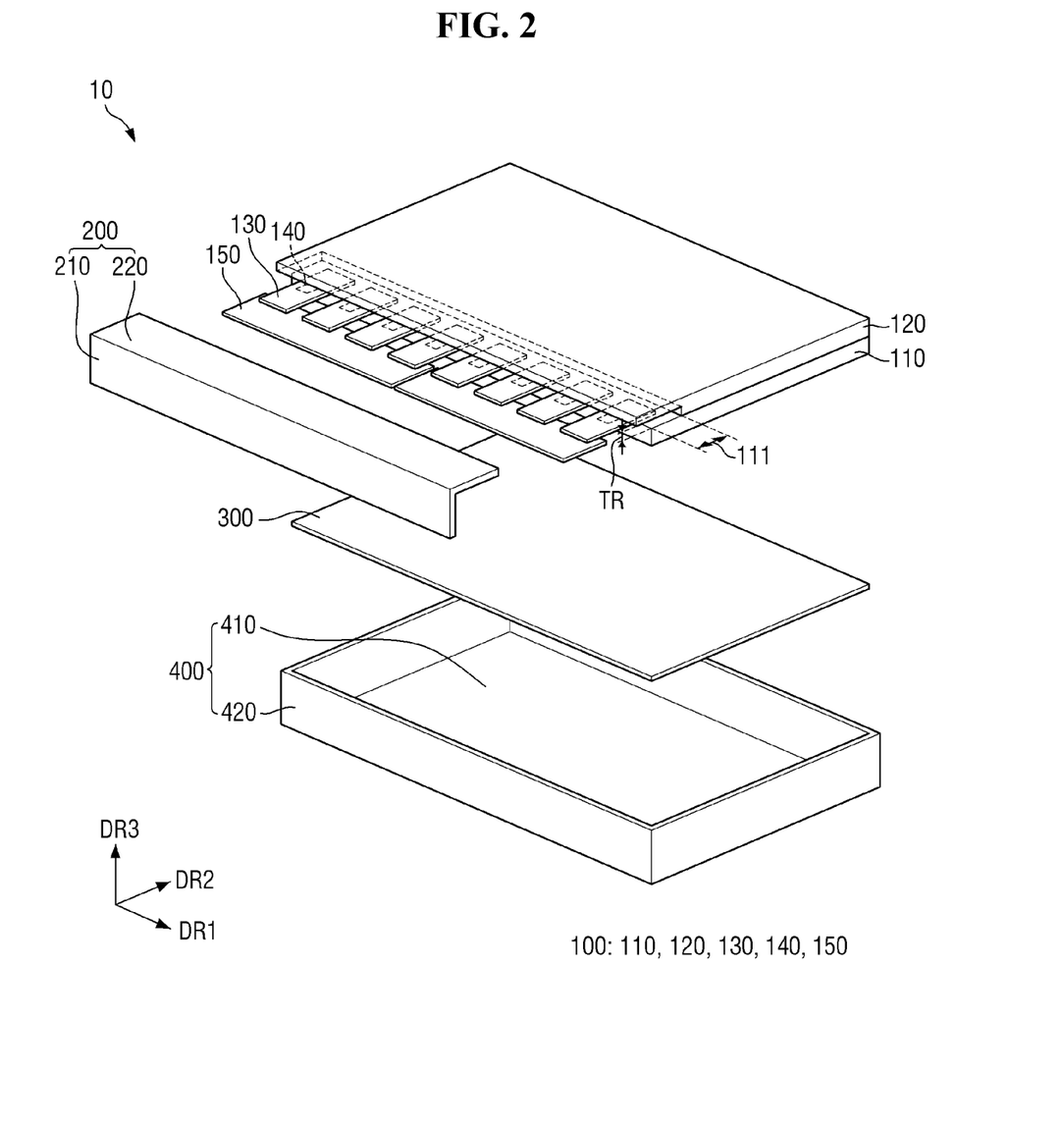
FIG. 2 is an exploded perspective view of the display device of FIG. 1.

FIG. 2 is an exploded perspective view of the display device of FIG. 1.

Referring to FIG. 2, the display device 10 may include a display panel 100, a light blocking chassis 200, a cover panel 300, and a lower storage container (or bottom chassis) 400.

The display panel 100 may have a shape corresponding to the shape of the display device 10 in a plan view. For example, the display panel 100 may have a substantially rectangular shape in a plan view. The display device 10 may have a substantially rectangular shape with substantially right-angled corners in a plan view. However, the disclosure is not limited thereto, and the display panel 100 may have a shape different from that of the display device 10 in a plan view.

The display panel 100 may include various light emitting display panels such as an organic light emitting display panel, an inorganic light emitting display panel, and a quantum dot light emitting display panel. However, the disclosure is not limited thereto, and the display panel 100 may include a light-receiving display panel such as a liquid crystal display panel. Hereinafter, a case where the display panel 100 may be an organic light emitting display panel will be described as an example.

The display panel 100 may emit light to display an image or images and a video. The display panel 100 may include a first substrate 110 and a second substrate 120 facing the first substrate 110. The first substrate 110 and the second substrate 120 may be formed to be rigid. The first substrate 110 and the second substrate 120 may include glass or the like within the spirit and the scope of the disclosure. However, the disclosure is not limited thereto, and in an embodiment, for example, the first substrate 110 and the second substrate 120 may be formed to be flexible. In this case, the first substrate 110 and the second substrate 120 may include plastic or the like within the spirit and the scope of the disclosure.

In a case that the display device 10 may be an organic light emitting display device, the display panel 100 may include, between the first substrate 110 and the second substrate 120, a circuit element layer including at least one thin film transistor, a light emitting element layer including an organic light emitting element, an optical wavelength conversion layer, a color filter layer, and the like, which may be disposed thereon. This will be described in detail later.

The first substrate 110 may include a pad portion (pad area) 111 on which an external device may be mounted. The pad portion 111 may be located or disposed in the non-display area NDA outside of the display area DA. A pad electrode PD (see FIG. 3) may be disposed in the pad portion 111 of the first substrate 110. The pad electrode PD may be electrically connected to one or an end of a connection film 130. The pad portion 111 may overlap an insertion portion 220 of the light blocking chassis 200.

The display panel 100 may include at least one connection film (for example, the connection film may be a printed circuit board) 130, a driving chip 140, and a circuit board 150.

One or an end of the connection film 130 may be connected to the pad portion 111 of the first substrate 110, and the other end thereof may be connected to the circuit board 150. The connection film 130 may be made of a flexible material that may be bent. Two or more connection films 130 may be provided. In a case that connection films (for example, eight connection films) 130 are provided, the connection films 130 may be disposed to be spaced apart from each other along the extending direction of the first long side LS1 of the display device 10.

The driving chip 140 may receive an external signal and generate a driving signal for driving the display panel 100. The external signal may be a signal supplied from the circuit board 150 and may include an image signal, various control signals, a driving voltage, and the like within the spirit and the scope of the disclosure. The driving chip 140 may be mounted on the connection film 130. However, the disclosure is not limited thereto, and the driving chip 140 may be mounted on the circuit board 150 or the first substrate 110. The driving chip 140 may be mounted on the same surface as one or a surface of the connection film 130 to which the circuit board 150 may be electrically connected, but is not limited thereto, and may be mounted on a surface opposite to the one surface of the connection film 130 to which the circuit board 150 may be electrically connected.

The circuit board 150 may output a signal to the display panel 100 or receive a signal from the display panel 100 through the connection film 130. In FIG. 2, for simplicity of description, the circuit board 150 is shown to be located or disposed on the same plane as the display panel 100, but the circuit board 150 may be disposed at various positions in an actual application example. For example, as the connection film 130 is bent, the circuit board 150 may be disposed below or on side surfaces of the display panel 100 and the cover panel 300. In this case, the connection film 130 may be bent while covering or overlapping a part or all of the side surfaces, which may be positioned at the first long side LS1, of the first substrate 110 of the display panel 100 and the cover panel 300.

The display panel 100 may include a recess structure TR. The recess structure TR may be disposed on the side surface of the display panel 100. The recess structure TR may be formed in a substantially intaglio shape toward the inside of the display panel 100 from the side surface thereof. The insertion portion 220 of the light blocking chassis 200 may be inserted and disposed in the recess structure TR. Accordingly, the width (length in the second direction DR2) of the bezel positioned at the first long side LS1 may be reduced. This will be described in detail later.

The light blocking chassis 200 may be disposed on the side surface of the display panel 100 to be coupled or connected to the display panel 100. The light blocking chassis 200 may be disposed, among the four sides LS1, LS2, SS1, and SS2 of the display device 10, on the side on which the pad portion 111 and/or the connection film 130 of the display panel 100 may be disposed. For example, the light blocking chassis 200 may be disposed, among the four sides LS1, LS2, SS1, and SS2 of the display device 10, on the first long side LS1 on which the pad portion 111 and/or the connection film 130 may be disposed. However, the disclosure is not limited thereto, and the light blocking chassis 200 may be disposed on at least one of the remaining three sides LS2, SS1, and SS2 other than the first long side LS1.

The light blocking chassis 200 may cover or overlap the connection film 130 and a side surface 110s of the first substrate 110. The light blocking chassis 200 may include a side portion 210 and the insertion portion 220 that may be bent and extend toward the display panel 100 at the edge of the side portion 210. The side portion 210 of the light blocking chassis 200 may cover or overlap a part of the side surface 110s of the first substrate 110 in the display panel 100 and a part of the connection film 130 disposed outside of the side surface 110s. The insertion portion 220 of the light blocking chassis 200 may be inserted into the recess structure TR, and may cover or overlap a part of the connection film 130 and the pad electrode PD positioned or disposed on the pad portion 111 of the first substrate 110.

The insertion portion 220 of the light blocking chassis 200 may be inserted into the display panel 100. The insertion portion 220 of the light blocking chassis 200 may be inserted into the recess structure TR formed between the first substrate 110 and the second substrate 120. Although not limited to the following, the insertion portion 220 of the light blocking chassis 200 may be interposed between the first substrate 110 and the second substrate 120 which may form the recess structure TR. For example, the display panel 100 and the light blocking chassis 200 may be coupled or connected to each other by the recess structure TR and the insertion portion 220 of the light blocking chassis 200.

The insertion portion 220 of the light blocking chassis 200 may cover or overlap the pad portion 111 of the first substrate 110, the connection film 130, and the like within the spirit and the scope of the disclosure. Accordingly, the above components may be prevented from being visually recognized from the outside and may be protected. As the insertion portion 220 of the light blocking chassis 200 is inserted into the display panel 100, the width (width in the second direction DR2) of the bezel at the first long side LS1 may be reduced. A black matrix (or light blocking layer) disposed at the edges of the first and second substrates 110 and 120 may be omitted, and a screen may be displayed in a portion overlapping the insertion portion 220 of the light blocking chassis 200. Accordingly, the width (length in the second direction DR2) of the bezel at the first long side LS1 recognized by a user may be reduced.

A detailed description of the light blocking chassis 200 will be described later.

The cover panel 300 may be disposed below the display panel 100. The cover panel 300 may include a heat dissipation member (not shown). The heat dissipation member (not shown) may serve to dissipate heat generated from the display panel 100 positioned thereabove. Although not limited to the following, the heat dissipation member (not shown) may include graphite, silver (Ag), copper (Cu), aluminum (Al), or the like within the spirit and the scope of the disclosure. The cover panel 300 is not limited thereto, and may include components that perform other roles.

The lower storage container 400 may accommodate the display panel 100, the light blocking chassis 200, the cover panel 300, and the like within the spirit and the scope of the disclosure. To this end, the lower storage container 400 may have an accommodation space that may accommodate the aforementioned members. The lower storage container 400 may include a bottom surface 410 and a sidewall 420 extending upward from each edge of the bottom surface 410 along the circumference or perimeter of the bottom surface 410. The display panel 100, the light blocking chassis 200, the cover panel 300, and the like may be sequentially stacked on the bottom surface 410 of the lower storage container 400 within the inner space of the sidewall 420 of the lower storage container 400. The sidewall 420 of the lower storage container 400 may be disposed to surround the side surfaces of the display panel 100, the light blocking chassis 200, and the cover panel 300.

A coupling or connecting relationship between the components of the display device 10 according to an embodiment will be described in detail with reference to FIGS. 3 to 5.

Figure 3:
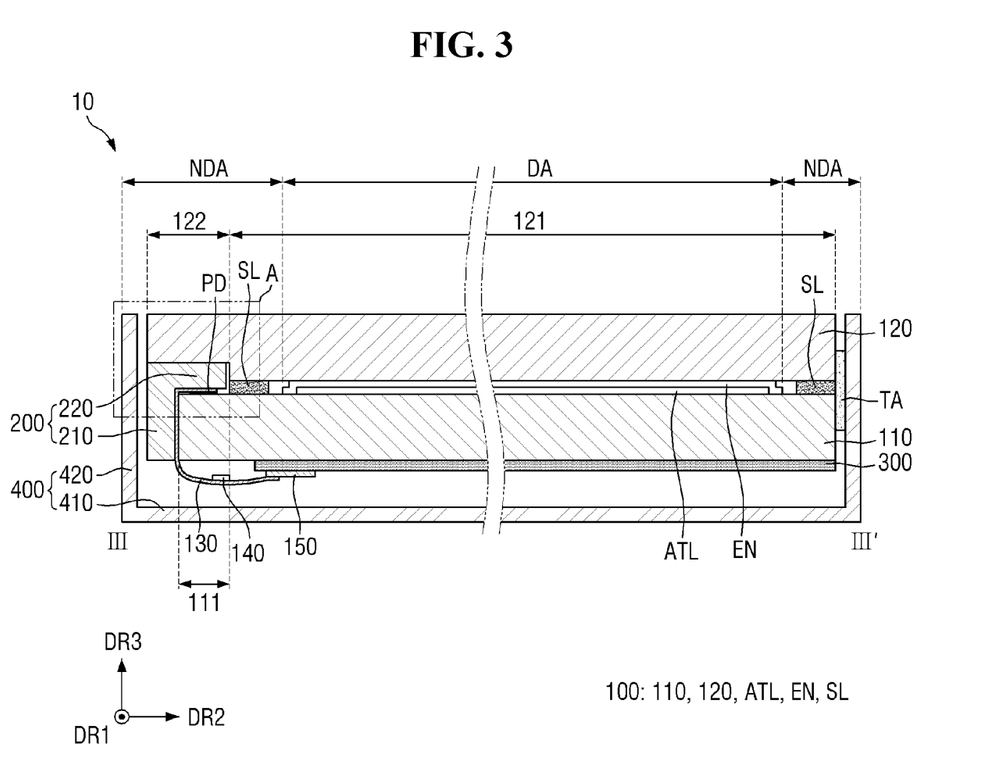
FIG. 3 is a schematic cross-sectional view taken along line III-III' of FIG. 1.

FIG. 3 is a schematic cross-sectional view taken along line III-III' of FIG. 1. FIG. 4 is an enlarged view of area A of FIG. 3. FIG. 5 is a schematic cross-sectional view taken along line V-V' of FIG. 1. FIG. 3 is a schematic cross-sectional view of portions at the first long side LS1 (see FIG. 1) and the second long side LS2 (see FIG. 1). FIG. 4 illustrates a state in which light L directed to the outside of the display panel 100 may be blocked. FIG. 5 is a schematic cross-sectional view of portions at the first short side SS1 (see FIG. 1) and the second short side SS2 (see FIG. 1).

Figure 4:
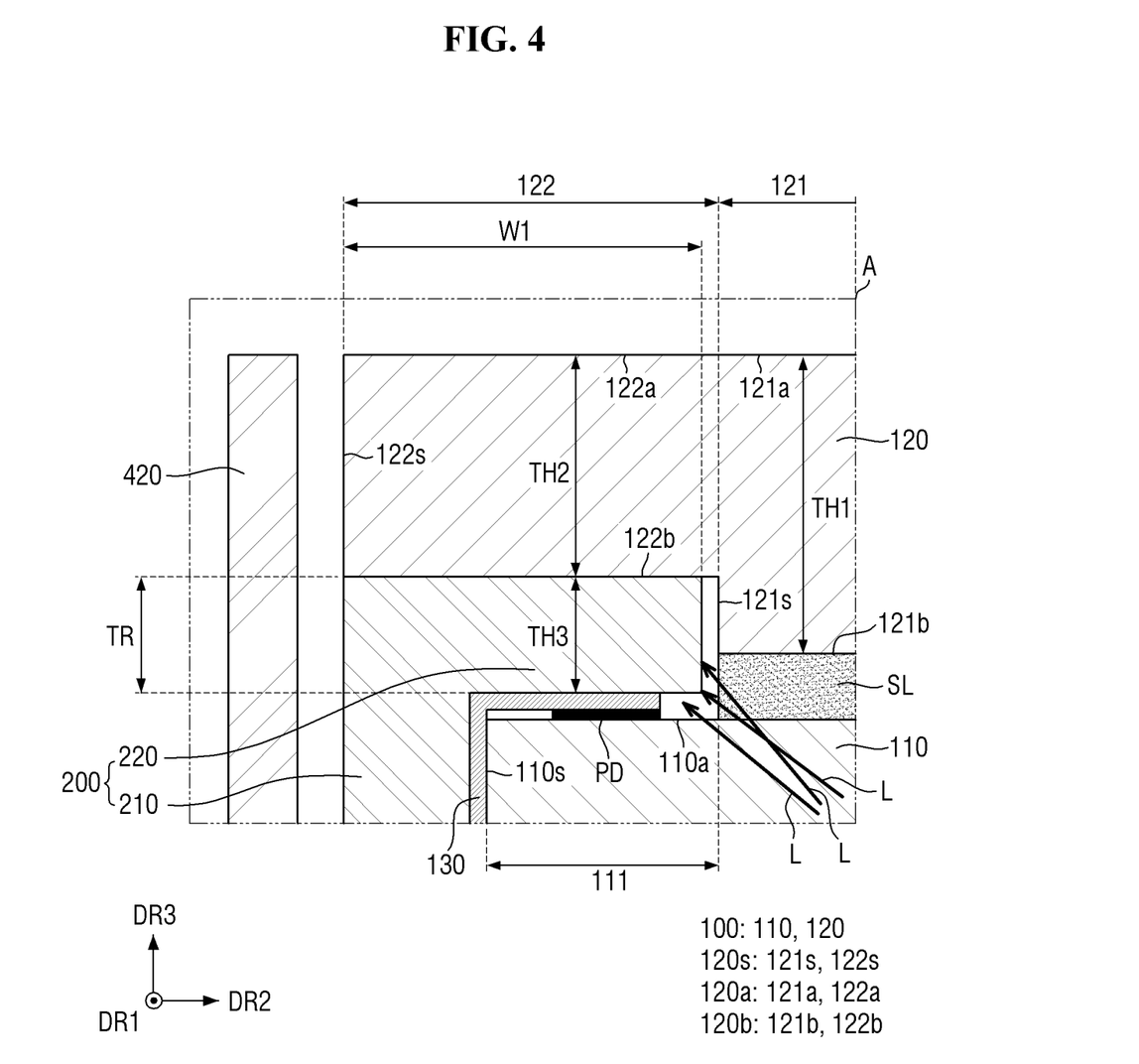
FIG. 4 is an enlarged view of area A of FIG. 3.
Figure 5:
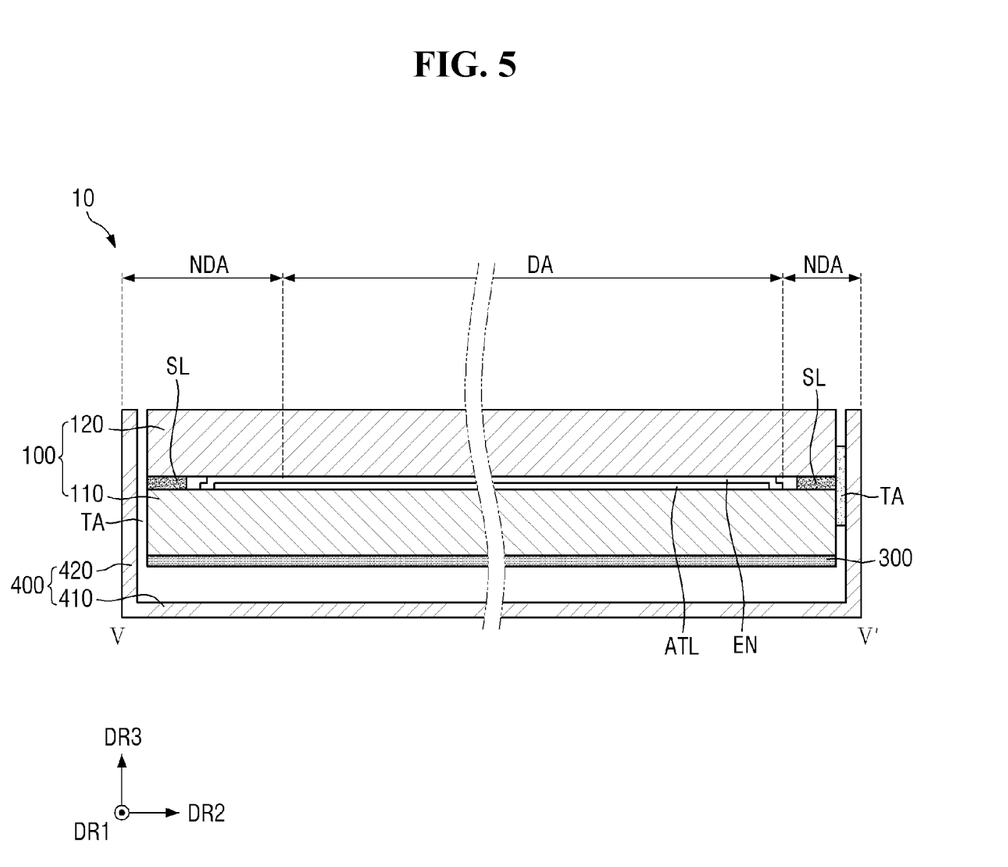
FIG. 5 is a schematic cross-sectional view taken along line V-V' of FIG. 1.

Referring to FIGS. 3 to 5, an element layer ATL including the circuit element layer having a circuit element and the light emitting element layer having a light emitting element, and an encapsulation layer EN (see FIG. 3) that may encapsulate the element layer ATL may be disposed on the first substrate 110. Although not shown, the optical wavelength conversion layer and the color filter layer may be disposed on the second substrate 120 in a direction toward the first substrate 110. A filler may be disposed between the first substrate 110 and the second substrate 120. However, the disclosure is not limited thereto. For example, the second substrate 120 may be omitted, and the circuit element layer, the light emitting element layer, the optical wavelength conversion layer, and the color filter layer may all be disposed on the first substrate 110. The display panel 100 may include a polarizing film disposed thereon.

A sealing member SL may be disposed between the first substrate 110 and the second substrate 120. The sealing member SL may be disposed in the non-display area NDA of the display panel 100 to surround the display area DA, and may encapsulate the element layer ATL of the display panel 100 together with the second substrate 120. The sealing member SL may seal a space between the second substrate 120 and the first substrate 110, and the space may exist in a vacuum state by removing moisture or air therefrom during the manufacturing process of the display device 10. The sealing member SL may prevent damage to the element layer ATL caused by air or moisture, together with the second substrate 120.

The second substrate 120 may overlap the pad portion 111 of the first substrate 110 in the thickness direction (third direction DR3), and may overlap a part of the connection film 130 mounted on the pad portion 111 in the thickness direction (third direction DR3).

The second substrate 120 of the display panel 100 may include a first region 121 and a second region 122. The second region 122 of the second substrate 120 may be located or disposed near the or an edge of the second substrate 120. The second region 122 of the second substrate 120 may be located or disposed on one or a side of the first region 121. Although not limited to the following, for example, the second region 122 of the second substrate 120 may be located or disposed at one or a side of the first region 121 in the second direction DR2.

The first region 121 of the second substrate 120 may not overlap the insertion portion 220 of the light blocking chassis 200, and the second region 122 of the second substrate 120 may overlap the insertion portion 220 of the light blocking chassis 200, the connection film 130, and the pad portion 111 of the first substrate 110. The first region 121 of the second substrate 120 may not overlap the recess structure TR, and the second region 122 of the second substrate 120 may overlap the recess structure TR.

The second substrate 120 may have a stepped structure in which the thickness thereof may decrease above the pad area 111 of the first substrate 110. At least a part of the insertion portion 220 of the light blocking chassis 200 may be disposed between the first substrate 110 and the second substrate 120 in a region where the stepped structure may be located or disposed. In other words, a thickness TH1 (width in the thickness direction (third direction DR3)) of the first region 121 of the second substrate 120 may be larger than a thickness TH2 (width in the thickness direction (third direction DR3)) of the second region 122. At least a part of the insertion portion 220 of the light blocking chassis 200 may be disposed between the second region 122 of the second substrate 120 and the first substrate 110.

The first substrate 110 may include one surface (or a top surface) 110*a*, the other surface (or a bottom surface, not shown) 110*b* opposite to the one surface 110*a*, and the side surface 110*s* connecting the one surface 110*a* to the other surface 110*b*. The second substrate 120 may include one surface (or a top surface) 120*a*, the other surface (or a bottom surface) 120*b* opposite to the one surface 120*a*, and a side surface 120*s* connecting the one surface 120*a* to the other surface 120*b*.

The one surface 120*a* of the second substrate 120 may include a first one surface 121*a* and a second one surface 122*a* at the side where the insertion portion 220 of the light blocking chassis 200 may be disposed. The first one surface 121*a* and the second one surface 122*a* of the second substrate 120 may be positioned at the same level. For example, the first one surface 121*a* and the second one surface 122*a* of the second substrate 120 may be positioned on the same plane.

The other surface 120*b* of the second substrate 120 may include a first other surface 121*b* and a second other surface 122*b* at the side where the insertion portion 220 of the light blocking chassis 200 may be disposed. The first other surface 121*b* may be located or disposed within the first region 121, and the second other surface 122*b* may be located or disposed within the second region 122. There may be a level difference between the first other surface 121*b* and the second other surface 122*b* of the second substrate 120. For example, with respect to the top or bottom surface of the first substrate 110, the second other surface 122*b* of the second substrate 120 may be positioned higher than the first other surface 121*b* of the second substrate 120. The first other surface 121*b* and the second other surface 122*b* of the second substrate 120 may be interconnected by a first side surface 121*s* of the second substrate 120.

The side surface 120*s* of the second substrate 120 may include the first side surface 121*s* and a second side surface 122*s* at the side where the insertion portion 220 of the light blocking chassis 200 may be disposed. The first side surface 121*s* may be located or disposed in the first area 121, and the second side surface 122*s* may be located or disposed in the second area 122. There may be a level difference between the first side surface 121*s* and the second side surface 122*s* of the second substrate 120. The second side surface 122s of the second substrate 120 may be disposed more outward than the first side surface 121s of the second substrate 120. The second side surface 122s of the second substrate 120 may be disposed more outward than the side surface 110s of the first substrate 110. The first side surface 121s of the second substrate 120 may be disposed more inward than the side surface 110s of the first substrate 110. For example, the side surface 110s of the first substrate 110 may be located or disposed between the second side surface 122s of the second substrate 120 and the first side surface 121s of the second substrate 120 in the second direction DR2. The first side surface 121s and the second side surface 122s of the second substrate 120 may be interconnected by the second other surface 122b.

Although not limited to the following, the second side surface 122s of the second substrate 120 may be aligned with the outer surface of the side portion 210 of the light blocking chassis 200 in the thickness direction (third direction DR3).

The recess structure TR may be formed or structured by the first substrate 110 and the second substrate 120 of the display panel 100. The recess structure TR may be formed toward the inside from the side surface of the display panel 100. The recess structure TR may be formed in a substantially intaglio shape in the second direction DR2 from the side surface of the display panel 100. For example, the recess structure TR may have a shape recessed from the side surface of the display panel 100 in a schematic cross-sectional view. One side or a side and the other side or another side of the recess structure TR in the thickness direction (third direction DR3) and the other side of the recess structure TR in the second direction DR2 may be closed by the display panel 100, and one side or a side of the recess structure TR in the second direction DR2 may be open. The recess structure TR may be formed by irradiating a laser onto the side surface of the display panel 100, but is not limited thereto.

The recess structure TR may be disposed at the first long side LS1 of the display panel 100, but is not limited thereto. In a case that the recess structure TR is disposed at the first long side LS1 of the display panel 100, the recess structure TR may extend in the first direction DR1.

The insertion portion 220 of the light blocking chassis 200 may be disposed between the first substrate 110 and the second substrate 120 of the display panel 100. For example, the insertion portion 220 of the light blocking chassis 200 may not only overlap the first substrate 110 of the display panel 100 in the thickness direction (third direction DR3), but may also overlap the second substrate 120 of the display panel 100 in the thickness direction (third direction DR3).

The insertion portion 220 of the light blocking chassis 200 may be inserted into the recess structure TR. The insertion portion 220 of the light blocking chassis 200 may overlap the pad portion 111 of the first substrate 110 in the thickness direction (third direction DR3), and may overlap at least a part of the connection film 130 mounted on the pad portion 111 in the thickness direction (third direction DR3). For example, the insertion portion 220 of the light blocking chassis 200 may overlap the second region 122 of the second substrate 120 in the thickness direction (third direction DR3).

The light blocking chassis 200 and the display panel 100 may be coupled or connected to each other by the insertion portion 220 of the light blocking chassis 200 and the recess structure TR of the display panel 100. For example, the insertion portion 220 of the light blocking chassis 200 may be fitted into the recess structure TR of the display panel 100, and accordingly, the display panel 100 and the light blocking chassis 200 may be coupled or connected to each other.

Although not limited to the following, while the insertion portion 220 of the light blocking chassis 200 is inserted into the recess structure TR of the display panel 100, the connection film 130 may be inserted into the recess structure TR together. In other words, before the insertion portion 220 of the light blocking chassis 200 is inserted into the recess structure TR of the display panel 100, the connection film 130 may be first bonded to the inner surface of the light blocking chassis 200, and the insertion portion 220 of the light blocking chassis 200 to which the connection film 130 has been bonded may be inserted into the recess structure TR.

The inner surface of the insertion portion 220 of the light blocking chassis 200 and the side surface of the recess structure TR in the second direction DR2 are shown to be spaced apart from each other in the second direction DR2. However, the disclosure is not limited thereto, and the inner surface of the insertion portion 220 of the light blocking chassis 200 and the side surface of the recess structure TR in the second direction DR2 may directly contact each other.

A thickness TH3 of the insertion portion 220 of the light blocking chassis 200 may be, for example, in a range of about 0.1 mm to about 0.3 mm or in a range of about 0.05 mm to about 0.4 mm, but is not limited thereto. For example, a width W1 (length in the second direction DR2) of the insertion portion 220 of the light blocking chassis 200 may be, for example, in at least one of a range of about 0.70 mm to about 0.99 mm, a range of about 0.50 mm to about 0.99 mm, or a range of about 0.3 mm to about 1.2 mm, but is not limited thereto.

Although not shown, a bonding member that may bond the light blocking chassis 200 with the display panel 100 may be disposed between the side portion 210 of the light blocking chassis 200 and the side surface 110s of the first substrate 110 of the display panel 100. A bonding member that may bond the light blocking chassis 200 with the lower storage container 400 may be disposed between the light blocking chassis 200 and the lower storage container 400. Accordingly, the light blocking chassis 200 may be more easily fixed.

The light blocking chassis 200 may block light in at least a partial region of the light blocking chassis 200. The light blocking chassis 200 may have a black color in the partial region of the light blocking chassis 200 that may block light. Although not limited to the following, for example, the insertion portion 220 of the light blocking chassis 200 may block light, and may have a black color in at least a partial region of the light blocking chassis 200.

For example, as the display panel 100 may include the recess structure TR, a space in which one or an end of the connection film 130 may be mounted may be provided on the one surface 110a of the first substrate 110 located or disposed in the second region 122 of the second substrate 120. Therefore, the first substrate 110 of the display panel 100 may not need to protrude to the outside of the second substrate 120 in order to provide a space in which one or an end of the connection film 130 may be mounted. Accordingly, the width (width in the second direction DR2) of the bezel at the first long side LS1 may be reduced.

For example, as the insertion portion 220 of the light blocking chassis 200 is disposed in the recess structure TR of the display panel 100, a black matrix may not be disposed between the first substrate 110 and the second substrate 120 of the display panel 100 at one side or a side on which the insertion portion 220 of the light blocking chassis 200 may be disposed. For example, a black matrix disposed on the edges of the first and second substrates 110 and 120 may be omitted at the first long side LS1 where the insertion portion 220 of the light blocking chassis 200 may be disposed. Even if the black matrix disposed on the edges of the first and second substrates 110 and 120 is omitted, the insertion portion 220 of the light blocking chassis 200 may be disposed on the edges of the first and second substrates 110 and 120, thereby blocking the light L directed to the outside of the display panel 100. Accordingly, even if the black matrix disposed on the edges is omitted, defects such as light leakage and color mixing in the display panel 100 may be prevented.

The insertion portion 220 of the light blocking chassis 200 may be disposed between the first substrate 110 and the second substrate 120 of the display panel 100, so that a separate component for covering or overlapping the display panel 100 may not be provided or disposed above the display panel 100. Therefore, while the component such as the connection film 130 disposed at the first long side LS1 (see FIG. 1) may be covered or overlapped by the light blocking chassis 200, light may be emitted to the outside in the vicinity of the edge at the first long side LS1 (see FIG. 1) to display a screen and an image. Accordingly, even if the component such as the connection film 130 and a display panel cover that may cover or overlap the component may be disposed at the first long side LS1 (see FIG. 1), the user may recognize as if the bezel does not exist. Accordingly, this may provide a higher sense of immersion to the user and may provide the use with a better overall experience.

The lower storage container 400 may be bonded to the display panel 100. Although not limited to the following, the sidewall 420 of the lower storage container 400 may be bonded to the first substrate 110 and/or the second substrate 120 of the display panel 100 on at least one of the three sides LS2, SS1, and SS2 (see FIG. 1) where the light blocking chassis 200 may not be disposed.

By way of example, on at least one of the second long side LS2 (see FIG. 1), the first short side SS1 (see FIG. 1), and the second short side SS2 (see FIG. 1), an adhesive member TA may be disposed between the sidewall 420 of the lower storage container 400 and the first substrate 110 and/or the second substrate 120 of the display panel 100. The adhesive member TA may include, for example, a double-sided adhesive tape, resin, or the like, but is not limited thereto. The adhesive member TA may be attached to at least a portion of the inner surface of the sidewall 420 and at least a portion of the outer surface of the first substrate 110 and/or the second substrate 120. The adhesive member TA may bond at least a portion of the sidewall 420 and at least a portion of the first substrate 110 and/or the second substrate 120 to each other. Accordingly, the adhesive member TA may bond the lower storage container 400 and the display panel 100 to each other. However, a method of bonding the lower storage container 400 and the display panel 100 is not limited thereto.

Hereinafter, other embodiments of the display device will be described. In the following embodiments, a description of the same components as those of the above-described embodiment will be omitted or simplified to avoid redundancy, and differences will be mainly described.

Figure 6:
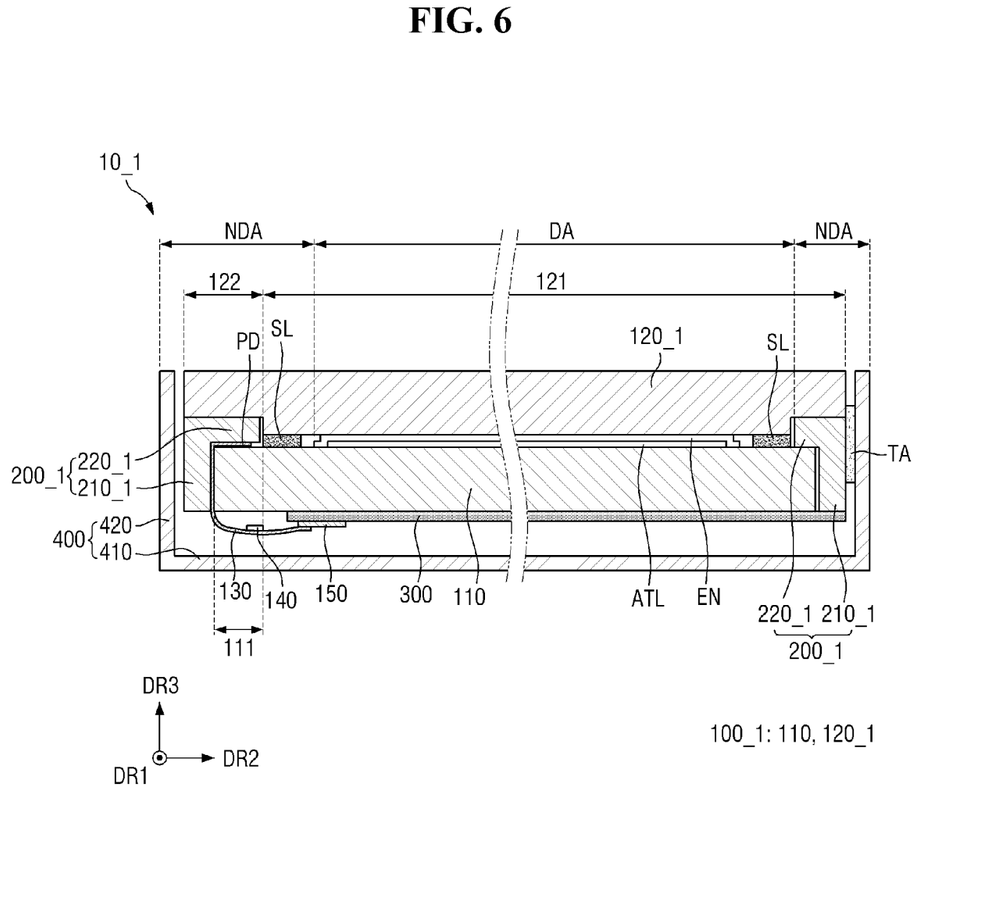
FIGS. 6 and 7 are schematic cross-sectional views of a display device according to an embodiment.
Figure 7:
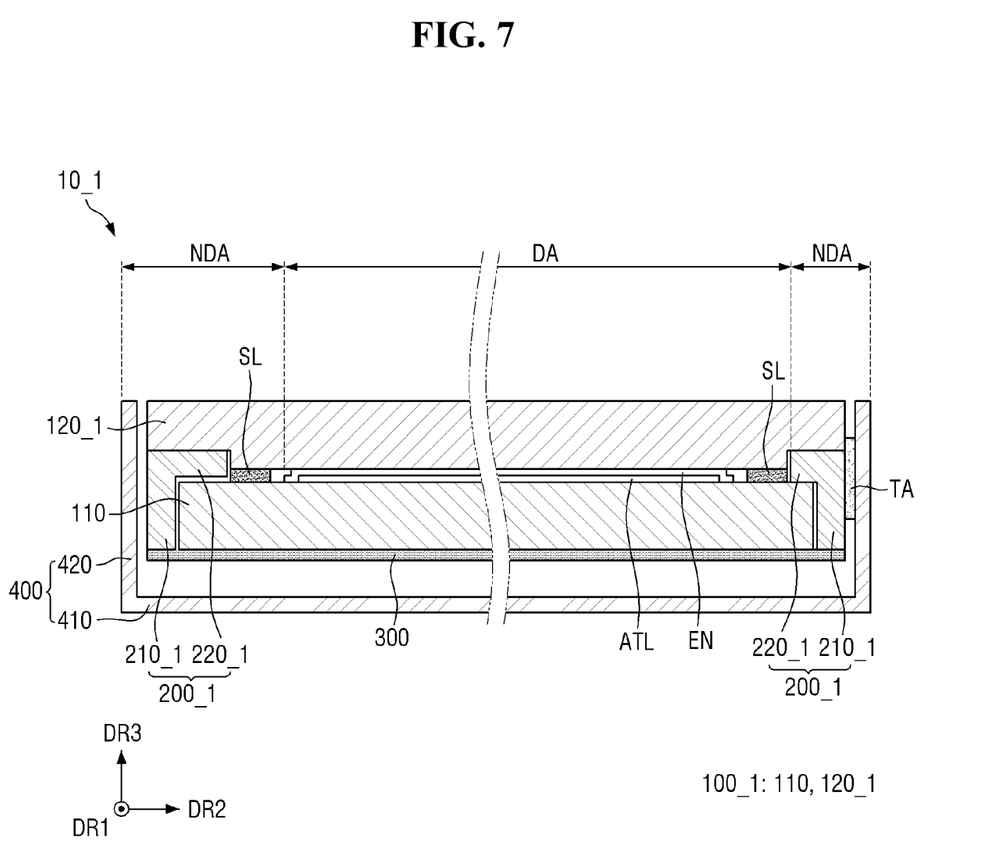

FIGS. 6 and 7 are schematic cross-sectional views of a display device according to an embodiment. FIG. 6 is a schematic cross-sectional view of a long side (LS1 or LS2, see FIG. 1) of a display device 10_1 according to an embodiment. FIG. 7 is a schematic cross-sectional view of a short side (SS1 or SS2, see FIG. 1) of the display device 10_1 according to an embodiment.

Referring to FIGS. 6 and 7, the display device 10_1 according to an embodiment may be different from that of an embodiment of FIGS. 3 and 5 in that a display panel cover 200_1 may be disposed not only on the first long side LS1 (see FIG. 1), but also on the other three sides LS2, SS1, and SS2 (see FIG. 1). In FIGS. 6 and 7, the second substrate is 120_1, the side portion of the light blocking chassis is 210_1 and the insertion portion of the light blocking chassis is 220_1.

By way of example, the display panel cover 200_1 according to an embodiment may be disposed not only on the first long side LS1 (see FIG. 1) but also on at least one of the other three sides LS2, SS1, and SS2 (see FIG. 1). The display panel cover 200_1 according to an embodiment is described as being disposed not only on the first long side LS1 (see FIG. 1) but also on the other three sides LS2, SS1, and SS2 (see FIG. 1), but is not limited thereto. The display panel covers 200_1 provided or disposed on the respective sides LS1, LS2, SS1 and SS2 (see FIG. 1) may be integrally formed, but are not limited thereto and may be provided separately.

Although not limited to the following, in a case that the display panel cover 200_1 is disposed on all of the four sides LS1, LS2, SS1 and SS2 (see FIG. 1), the lower storage container 400 may be omitted.

A display panel 100_1 according to an embodiment may include the recess structure TR, and the recess structure TR may be disposed not only at the first long side LS1 (see FIG. 1) but also at the other three sides LS2, SS1, and SS2 (see FIG. 1). The recess structures TR disposed at the respective sides LS1, LS2, SS2 and SS2 (see FIG. 1) may be connected to each other and formed integrally, but are not limited thereto, and may be disposed separately.

Even in this case, the width (width in the second direction DR2) of the bezel at the first long side (LS1, see FIG. 1) may be reduced, so that the user may feel as if the bezel does not exist and may be provided with a higher sense of immersion and a better overall experience.

Figure 8:
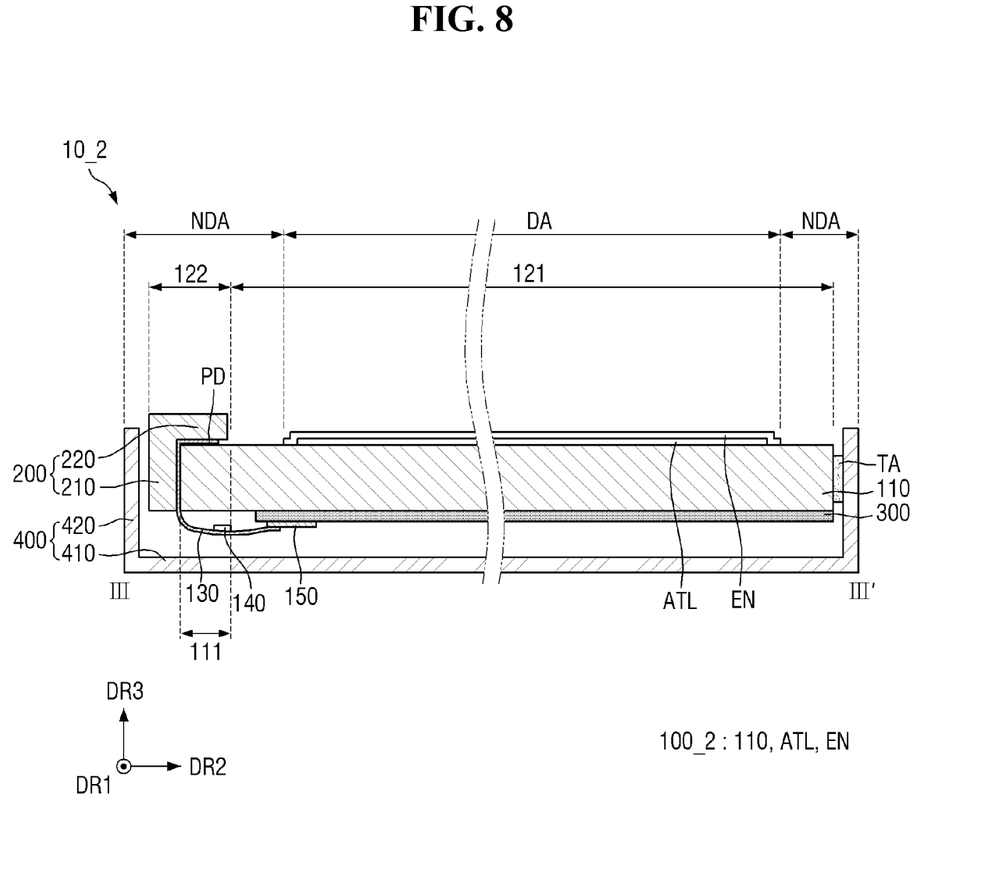
FIG. 8 is a schematic cross-sectional view of a display device according to an embodiment.

FIG. 8 is a schematic cross-sectional view of a display device according to an embodiment. FIG. 8 is a schematic cross-sectional view of a long side (LS1 or LS2, see FIG. 1) of a display device 10_2 according to an embodiment.

Referring to FIG. 8, the display device 10_2 according to an embodiment may be different from that of an embodiment of FIG. 3 in that the second substrate 120 (see FIG. 3) may not be included.

By way of example, a display panel 100_2 of the display device 10_2 according to an embodiment may include the first substrate 110 but may not include the second substrate 120 (see FIG. 3). Therefore, on the first substrate 110 of the display panel 100_2 according to an embodiment, the element layer ATL including the circuit element layer and the light emitting element layer, and the encapsulation layer EN that may encapsulate the element layer ATL may be provided or disposed. Although not shown, the optical wavelength conversion layer and the color filter layer may be disposed on the encapsulation layer EN.

Even in this case, the light blocking chassis 200 may cover or overlap the connection film 130 and the side surface 110s (see FIG. 4) of the first substrate 110 of the display panel 100_2. Accordingly, the width (width in the second direction DR2) of the bezel at the first long side LS1 (see FIG. 1) may be reduced, so that the user may feel as if the bezel does not exist and may be provided with a higher sense of immersion and a better overall experience.

Figure 9:
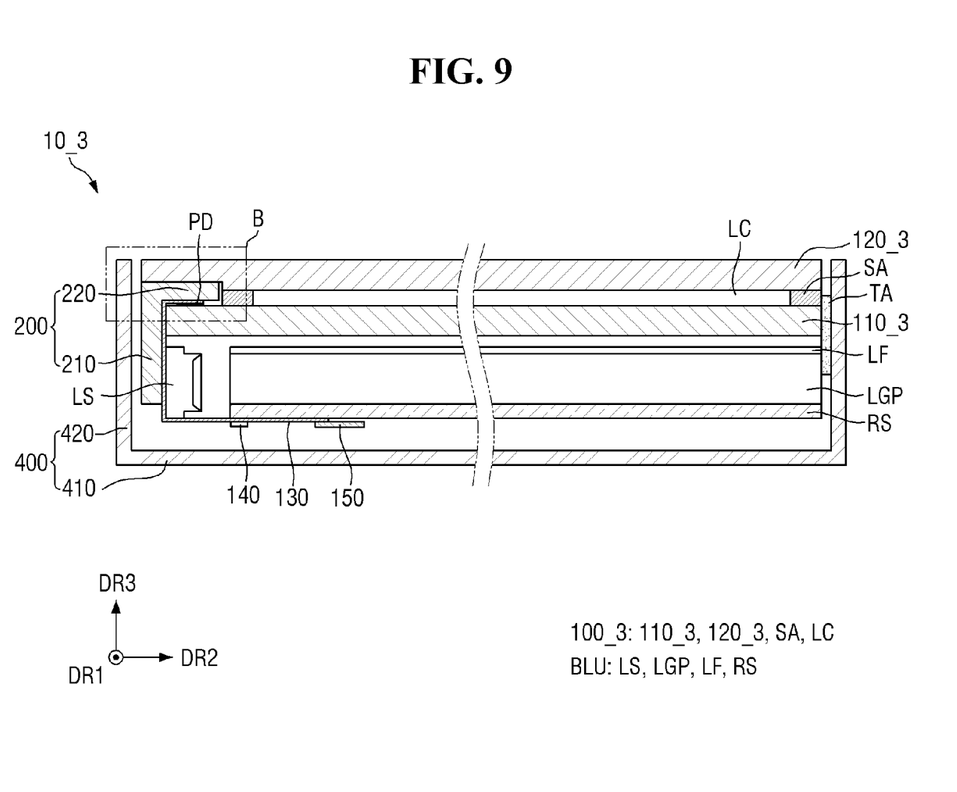
FIG. 9 is a schematic cross-sectional view of a display device according to an embodiment.
Figure 10:
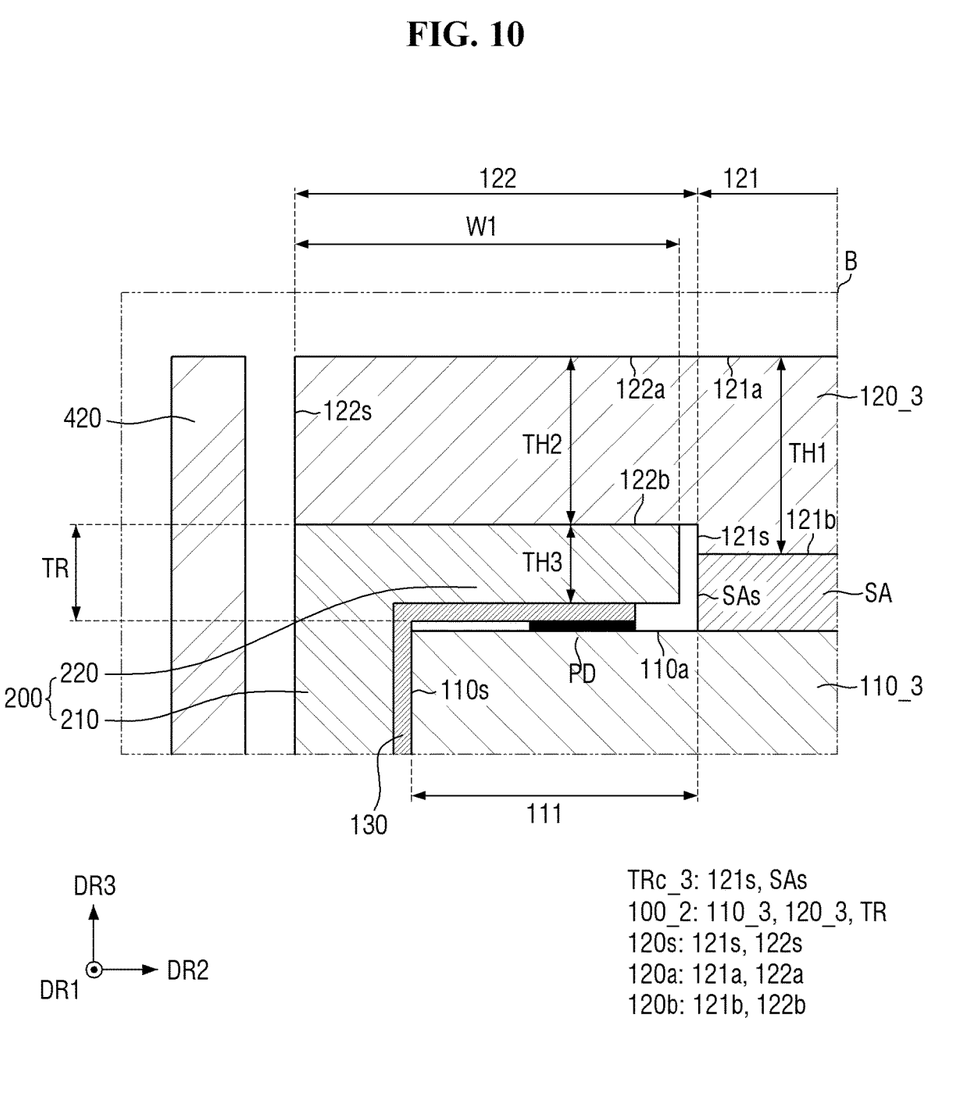
FIG. 10 is an enlarged view of area B of FIG. 9.

FIG. 9 is a schematic cross-sectional view of a display device according to an embodiment. FIG. 10 is an enlarged view of area B of FIG. 9. FIG. 9 is a schematic cross-sectional view of a long side (LS1 or LS2, see FIG. 1) of a display device 10_3 according to an embodiment.

Referring to FIGS. 9 and 10, the display device 10_3 according to an embodiment may be different from that of an embodiment of FIGS. 3 and 4 in that a display panel 100_3 may include a liquid crystal layer LC. Hereinafter, the display device 10_3 according to an embodiment will be described as being a liquid crystal display device, but is not limited thereto.

By way of example, the display panel 100_3 according to an embodiment may include a first substrate 110_3, a second substrate 120_3 facing the first substrate 110_3, the liquid crystal layer LC interposed between the first substrate 110_3 and the second substrate 120_3, and a sealing member SA disposed at the edge between the first substrate 110_3 and the second substrate 120_3. The sealing member SA may serve to confine the liquid crystal layer LC. The sealing member SA may include a side SAs that may abut the first region 121 and the second region 122. The first substrate 110_3 may be a thin film transistor substrate including a thin film transistor. The second substrate 120_3 may be a color filter substrate including a color filter, as a counter substrate. The display panel 100_3 may include a polarizing film (or anti-reflection film, not shown), and the polarizing film (or anti-reflection film, not shown) may be disposed above and below the display panel 100_3.

The display device 10_3 according to an embodiment may include a backlight unit BLU instead of the cover panel 300. The backlight unit BLU may include a light source module LS that may provide light to the display panel 100_3, a light guide plate LGP that may guide the light provided from the light source module LS, an optical film LF disposed above the light guide plate LGP and having an optical functional layer, and a reflective sheet RS disposed below the light guide plate LGP and guiding the leaking light back to the light guide plate LGP. The backlight unit BLU may be accommodated in the lower storage container 400 together with the display panel 100_3.

The optical film LF may include at least one of films such as a prism film, a diffusion film, a microlens film, a lenticular film, a polarizing film, a reflective polarizing film, a retardation film, and a wavelength conversion film. The display device 10_3 may include optical films LF of the same type or different types. The wavelength conversion film may include wavelength conversion particles. The wavelength conversion particles may be particles that may convert the wavelength of incident light, and may be formed of, for example, quantum dots (QD), a fluorescent material, or a phosphorescent material.

In the display device 10, a backlight unit may include a light source module that provides light to a liquid crystal display panel, an optical member that guides or diffuses the light emitted from the light source module, an optical film having an optical functional layer, a reflective sheet that guides the leaking light back to the liquid crystal display panel, and the like within the spirit and the scope of the disclosure.

Even in this case, the width of the bezel (width in the second direction DR2) at the first long side LS1 (see FIG. 1) may be reduced, so that the user may feel as if the bezel does not exist and may be provided with a higher sense of immersion and a better overall experience.

In concluding the detailed description, those skilled in the art will appreciate that many variations and modifications may be made to the embodiments without substantially departing from the principles of the disclosure. Therefore, the disclosed embodiments are used in a generic and descriptive sense only and not for purposes of limitation.

What is claimed is:

1. A display device comprising:
a first substrate including a first side surface, a display area, and a pad area located outside of the display area and adjacent to the first side surface;
a second substrate facing the first substrate, the second substrate including a second side surface extending farther outward than the first side surface of the first substrate;
a printed circuit board electrically connected to the pad area of the first substrate and bent along the first side surface of the first substrate;
a light blocking chassis overlapping and covering the printed circuit board and the first side surface of the first substrate in plan view; and
a sidewall covering the first side surface, the second side surface, and the light blocking chassis.

2. The display device of claim 1, wherein the light blocking chassis blocks light in at least a partial region of the light blocking chassis.

3. The display device of claim 2, wherein the light blocking chassis has a black color in at least the partial region of the light blocking chassis.

4. The display device of claim 1, wherein organic light emitting elements are disposed in the display area of the first substrate.

5. The display device of claim 1, further comprising:
a liquid crystal layer interposed between the first substrate and the second substrate.

6. The display device of claim 1, wherein the light blocking chassis further covers and overlaps a portion of the pad area that is disposed on the first substrate.

7. The display device of claim 1, wherein a top surface of the light blocking chassis extends beyond the top surface of the printed circuit board in a longitudinal direction and a direction opposite to the longitudinal direction.

8. A display device comprising:
a first substrate including a first side surface, a display area, and a pad area located outside of the display area and adjacent to the first side surface;
a second substrate facing the first substrate, the second substrate including a second side surface extending farther outward than the first side surface of the first substrate;
a printed circuit board electrically connected to the pad area of the first substrate and bent along the first side surface of the first substrate; and
a light blocking chassis overlapping the printed circuit board and the first side surface of the first substrate, wherein
the second substrate includes:
a first region having a first thickness; and
a second region having a second thickness which is smaller than the first thickness, the second region being disposed outside of the first region, and
the second region at least partially overlaps the light blocking chassis.

9. The display device of claim 8, wherein a part of the light blocking chassis is disposed in a space between the printed circuit board and the second region of the second substrate.

10. The display device of claim 8, wherein the second region of the second substrate overlaps the light blocking chassis in a plan view.

11. The display device of claim 10, wherein the second side surface of the second substrate is aligned with an outer surface of the light blocking chassis.

12. The display device of claim 8, wherein
the second substrate further includes a surface and another surface opposite to the surface, the another surface of the second substrate facing a top surface of the first substrate,
the another surface of the second substrate includes:
a first other surface located in the first region of the second substrate; and
a second other surface located in the second region of the second substrate, and
the second other surface is higher than the first other surface with respect to the top surface of the first substrate.

13. The display device of claim 12, wherein
the surface of the second substrate includes:
a first surface disposed in the first region of the second substrate; and
a second surface disposed in the second region of the second substrate, and
the first surface and the second surface are disposed on a same plane.

14. The display device of claim 8, wherein the light blocking chassis includes:
an insertion portion, at least a part of the insertion portion being disposed between the second region of the second substrate and the first substrate; and
a side portion extending downward from an end of the insertion portion.

15. The display device of claim 14, wherein a thickness of the insertion portion of the light blocking chassis is in a range of about 0.1 mm to about 0.3 mm.

16. The display device of claim 15, wherein
the insertion portion of the light blocking chassis extends in a first direction perpendicular to a thickness direction, and
a width of the insertion portion of the light blocking chassis in the thickness direction and a second direction perpendicular to the first direction is in a range of about 0.50 mm to about 0.99 mm.

17. A display device comprising:
a display substrate including a first side surface, a display area, and a pad area located outside of the display area and adjacent to the first side surface;
a printed circuit board electrically connected to the pad area of the display substrate and bent along the first side surface of the display substrate;
a light blocking chassis overlapping and covering the printed circuit board and the first side surface of the display substrate in plan view; and
a sidewall covering the first side surface and the light blocking chassis, wherein
the light blocking chassis is in contact with a surface of the printed circuit board.

18. The display device of claim 17, wherein the light blocking chassis blocks light in at least a partial region of the light blocking chassis.

19. The display device of claim 18, wherein the light blocking chassis has a black color in at least a partial region of the light blocking chassis.

20. The display device of claim 17, wherein organic light emitting elements are disposed in the display area of the display substrate.

21. The display device of claim 17, wherein the light blocking chassis includes an insertion portion overlapping the display substrate and a side portion extending from an end of the insertion portion to overlap at least a part of the first side surface of the display substrate.

22. The display device of claim 21, wherein a thickness of the insertion portion of the light blocking chassis is in a range of about 0.1 mm to about 0.3 mm.

* * * * *